United States Patent [19]

Ohhinata et al.

[11] 4,039,865
[45] Aug. 2, 1977

[54] SEMICONDUCTOR SWITCH

[75] Inventors: Ichiro Ohhinata, Yokohama; Shinzi Okuhara, Fujisawa; Michio Tokunaga, Zushi, all of Japan

[73] Assignee: Hitachi, Ltd., Japan

[21] Appl. No.: 596,094

[22] Filed: July 15, 1975

[30] Foreign Application Priority Data

July 19, 1974  Japan ................................. 49-82168

[51] Int. Cl.$^2$ .......................................... H03K 17/72
[52] U.S. Cl. ............................. 307/252 G; 307/252 J; 307/252 N; 307/305
[58] Field of Search ................... 307/252 A, 202, 299, 307/305, 252 J, 252 N, 252 G; 357/38

[56] References Cited
U.S. PATENT DOCUMENTS 3,723,769   3/1973   Collins ............................ 307/252 N Primary Examiner—John Zazworsky
Attorney, Agent, or Firm—Craig & Antonelli

[57] ABSTRACT

A semiconductor switch comprising a PNPN switch having an equivalently four-layer structure of p, n, p and n regions and three PN junctions; a transistor; two impedance elements and a capacitive element, wherein the transistor and one of the impedance elements is connected in parallel to each other, the parallel circuit thus formed being connected between the p base and the cathode of the PNPN switch, the capacitive element is connected between the base of the transistor and the anode of the PNPN switch, and the other impedance element is connected between the base and the emitter of the transistor, so that the obtained semiconductor switch has a high dv/dt withstandingness independent of the potential at the anode or cathode and a high breakdown voltage, can be closed with a small control current and is adapted for high speed switching.

15 Claims, 6 Drawing Figures

SEMICONDUCTOR SWITCH

BACKGROUND OF THE INVENTION

1. Field of the Invention

The present invention relates to a semiconductor switch having a four-layer structure of p, n, p and n regions and three PN junctions, which is used as a switching element in control devices.

2. Description of the Prior Art

The examples of a semiconductor switch having a PNPN structure (hereafter referred to as a PNPN switch) are a PNPN diode having only anode and cathode electrodes, a three-terminal thyristor having a cathode gate control terminal in addition to anode and cathode terminals, and a four-terminal thyristor having both anode gate control terminal and cathode gate control terminal, besides anode and cathode. The PNPN switch is widely used in a variety of control devices, to serve as a switching element having a self-holding function.

However, the PNPN switch has a drawback that it is rendered conductive if a forward voltage is suddenly applied between the anode and cathode thereof in its cut-off state. This phenomenon is known as rate effect (also $dv/dt$ effect) and numerous methods have been proposed to prevent the rate effect.

Most peferably practiced methods are to connect a resistor between the cathode K and the cathode gate $G_K$ of PNPN switch, and to connect the anode gate $G_A$ of a PNPN switch with a high potential through a resistor so as to establish a reverse bias between the anode A and the anode gate $G_A$ of the PNPN switch. According to the former method, however, it is useless unless the resistor has so small a resistance that the built-in voltage between the cathode gate $G_K$ and the cathode K may not be exceeded by the voltage drop developed across the resistor when the displacement current flowing through the junction capacitance $C_{J2}$ between the cathode gate and the anode gate flows through the resistor. Therefore, in order to obtain a high $dv/dt$ withstandingness, the resistor must have a very small resistance. For example, if the junction capacitance is $2pF$, the resistance must be less than 600 ohms to obtain a $dv/dt$ withstandingness of 500v/microsec. Accordingly, those parts of the gate drive current and the holding current which flow through the resistor must be compensated through the extra supply of current. Thus, the first method has a drawback that an extra gate current of about 1mA must be supplied. On the other hand, according to the latter method, the potential must be higher than that at the anode, and moreover the second method has also a drawback that the rate effect is prevented when the anode potential shifts to a higher level while it cannot be prevented when the cathode potential is changed to a lower level.

FIGS. 1 and 2 show circuits disclosed in the U.S. Pat. No. 3,609,413 specification, which look most like the semiconductor switch according to the present invention, so far as the applicants' search is concerned. FIGS. 1 and 2 attached to the present specification corresponds to FIGS. 1 and 3 attached to the U.S. Pat. No. 3,609,413 specification, the reference numerals and characters being the same.

In order to prevent the rate effect, the junction capacitance between the emitter 19 and the base of the transistor $T_3$ is utilized in the circuit in FIG. 1 while in the circuit in FIG. 2 the transient voltage applied to the anode is differentiated by the capacitor 34 to actuate the transistor $T_5$. According to the circuit in FIG. 1, however, a circuit consisting of the emitter 19, the base and the emitter 18 of the transistor $T_3$ is inserted between the anode and the cathode and an ordinary base-emitter junction breakdown voltage is at most 5-10V. Consequently, the circuit cannot be used for voltages higher than 5V and is disadvantageous in the one of the functions of a PNPN switch, that is, the feature of high breakdown voltage in both positive and negative directions is cancelled. Moreover, if the circuits shown in FIGS. 1 and 2 are used to repeatedly fire and cut off in response to every other pulse of a pulse train with high speed repetitions, say, about 1 ms arriving at the anode, the residual charges accumulate in the capacitor 34 or the junction capacitor and the base of the transistor $T_3$ or $T_5$ so that the $dv/dt$ withstandingness is considerably lowered.

SUMMARY OF THE INVENTION

One object of the present invention is to provide a semiconductor switch of PNPN structure, having a high $dv/dt$ withstandingness independent of the potential at the anode or the cathode.

Another object of the present invention is to provide a semiconductor switch of PNPN structure, having a high $dv/dt$ withstandingness and a high withstanding voltage in both positive and negative direction.

Yet another object of the present invention is to provide a semiconductor switch of PNPN structure, which can be rendered conductive with a small control current.

A still further object of the present invention is to provide a semiconductor switch of PNPN structure, which is adapted for high speed switching.

According to the present invention, therefore, there is provided a semiconductor switch comprising a PNPN switch having an equivalently four-layer strucute of p, n, p and n regions and three PN junctions; a transistor; two impedance elements and a capacitive element, wherein the transistor is connected in parallel to one of the impedance elements, the thus formed parallel circuit is so connected as to shunt one of the three PN junctions which is located at one extreme end terminal, the capacitive element is connected between the base of the transistor and the other end terminal of the PNPN switch, and the other impedance element is connected between the base and the emitter of the transistor.

DESCRIPTION OF THE PREFERRED EMBODIMENT

Figure 1:
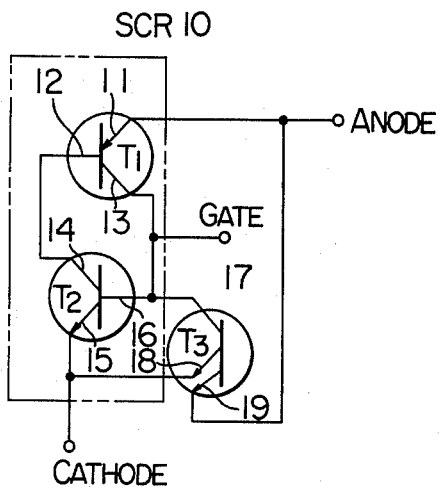
FIGS. 1 and 2 show the circuits of well known semiconductor switches which look most like the semiconductor switch according to the present invention.
Figure 2:
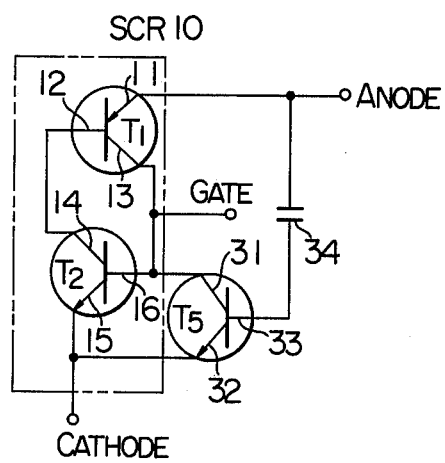
Figure 3:
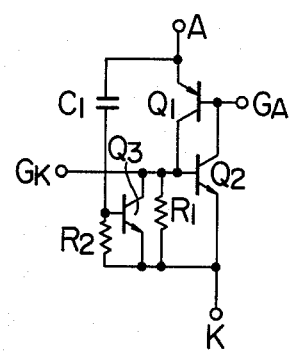
FIG. 3 is an equivalent circuit of a semiconductor switch as a first embodiment of the present invention.

In FIG. 3 showing an equivalent circuit of a semiconductor switch as a first embodiment of the present invention, a PNP transistor $Q_1$ and an NPN transistor $Q_2$ constitute a PNPN switch 1; a resistor $R_1$ serves to prevent a small $dv/dt$ effect; a transistor $Q_3$ is provided for preventing a large $dv/dt$ effect; a capacitor $C_1$ is intended to transiently drive the transistor $Q_3$; and a resistor $R_2$ provides a path for discharging the charges accumulated in the capacitor $C_1$ and the transistor $Q_3$.

The PNPN switch 1 having such a structure as described above has a positive feedback loop; base of transistor $Q_2$-collector of transistor $Q_2$-base of transistor $Q_1$-collector of transistor $Q_1$-base of transistor $Q_2$, and when a gate current is drawn into the cathode gate $G_K$, the transistors $Q_1$ and $Q_2$ are driven into the active state. When the gain of the positive feedback loop exceeds unity, a rapid switching operation can be expected. Upon switching, the transistors $Q_1$ and $Q_2$ are simultaneously rendered conductive to establish a conduction path between the anode A and the cathode K. This state is held thereafter.

Next, if a voltage having a large $dv/dt$ is applied between the anode A and the cathode K of the PNPN switch 1, the transistor $Q_3$ is driven through the capacitor $C_1$ to supply a sufficient drive current so that the transistor $Q_3$ in its saturated region absorbs the charging current (transient current) flowing into the cathode gate-anode gate junction $C_{J2}$ of the PNPN switch 1 to prevent the erroneous conduction of the PNPN switch 1. This conduction is mathematically described by the following expression:

$$(C_1 \frac{dv}{dt} - \frac{V_{BEQ_3}}{R_2}) \beta Q_3 > C_{J2} \frac{dv}{dt} (1 + \beta Q_1)$$

where $\beta Q_1$ and $\beta Q_3$ are respectively the current gain of the transistors $Q_1$ and $Q_3$ wired in common emitter configuration and $V_{BEQ_3}$ is the base-emitter forward voltage of the transistor $Q_3$. Thus, if the capacitance $C_1$ and the current gain $\beta Q_3$ are made large enough, the rate effect can be prevented by means of the transistor $Q_3$. In this case, the collector series resistance $r_{CS}$ of the transistor $Q_3$ should be so small that the collector-emitter saturation voltage $V_{CESQ_3}$ may be lower than the base-emitter forward voltage of the transistor $Q_2$.

On the other hand, if a voltage having a small value of $dv/dt$ is applied between the anode and the cathode, that is, if $$C_1 \frac{dv}{dt} > \frac{V_{BEQ_3}}{R_2},$$

the transistor $Q_3$ is cut off, the rate effect in this case being prevented by means of the resistor $R_1$. Since the rate effect which might be caused by large $dv/dt$ can be prevented by the transistor $Q_3$ while the rate effect which might take place due to small $dv/dt$ can be prevented by the resistor $R_1$, then the resistance $R_1$, then the resistance $R_1$ can be made large.

Moreover, in this circuit, since the electric charges accumulated in the capacitor $C_1$ and the transistor $Q_3$ are discharged through the resistor $R_2$, the $dv/dt$ withstandingness will never be lowered during a high speed switching operation.

As described above, the circuit shown in FIG. 3 has such useful points as follows.

a. If a voltage signal having an appreciable $dv/dt$ is applied between the anode A and the cathode K, the transistor $Q_3$ is automatically driven through the capacitor $C_1$ independently of the anode and cathode potential so that the rate effect can be prevented.

b. Since the resistance $R_1$ can be very large, the gate sensitivity in the case where the PNPN switch 1 is triggered by applying the gate current to the base of the transistor $Q_2$ is very high.

c. Since the electric charges accumulated in the capacitor $C_1$ and the transistor $Q_3$ are discharged through the resistor $R_2$, the $dv/dt$ withstandingness will never be lowered during high speed switching operation.

Figure 4:
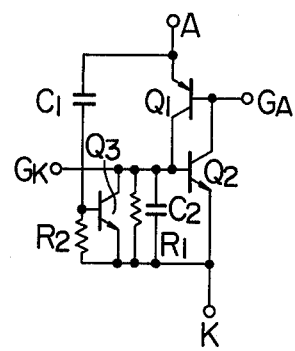
FIG. 4 is an equivalent circuit of a semiconductor switch as a second embodiment of the present invention.

FIG. 4 is an equivalent circuit of a semiconductor switch as a second embodiment of the present invention and this circuit is the same as that shown in FIG. 3 except a capacitor $C_2$ connected in parallel with the resistor $R_1$. The capacitor $C_2$ provides a bypass only for transient current and serves as a high impedance in the steady state and therefore the circuit, like that shown in FIG. 3, has a high $dv/dt$ withstandingness and a high sensitivity.

Figure 5:
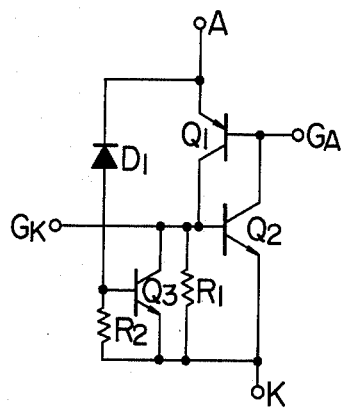
FIG. 5 is an equivalent circuit of a semiconductor switch as a third embodiment of the present invention.

FIG. 5 is an equivalent circuit of a semiconductor switch as a third embodiment of the present invention and this circuit is also the same as that shown in FIG. 3 except the sole substitution of the capacitor $C_1$ by a diode $D_1$. Accordingly, the circuit in FIG. 5 operates just as that in FIG. 3.

Figure 6:
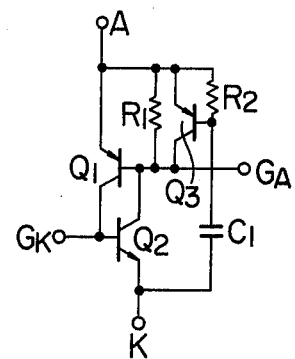
FIG. 6 is an equivalent circuit of a semiconductor switch as a fourth embodiment of the present invention.

FIG. 6 is an equivalent circuit of a semiconductor switch as a fourth embodiment of the present invention, which is complementary to the structure of the semiconductor switch shown in FIG. 3. In FIG. 6, the parallel circuit of the transistor $Q_3$ and the resistor $R_1$ is connected between the anode A and the anode gate $G_A$, and the capacitor $C_1$ serving to drive the transistor $Q_3$ only in the transient period, is connected between the base and the cathode of the transistor $Q_3$. The resistor $R_2$ serves as a path through which the electric charges accumulated in the capacitor $C_1$ and the transistor $Q_3$ are discharged. With this circuit, the transistor $Q_3$ is operated in its saturated region upon application of a signal having a large value of $dv/dt$ across the anode and the cathode while the resistor $R_1$ plays the leading role for a small value of $dv/dt$ which is insufficient to turn the transistor $Q_3$ on, that is, the base emitter junction of the transistor $Q_1$ is prevented from being forward biassed so that the erroneous conduction of the PNPN switch may be prevented. Since the resistor $R_1$ can have a high resistance and the transistor $Q_3$ is cut off in the steady state, the switch can be rendered conductive by a small control current. The capacitor $C_2$ may be replaced by another capacitive element such as a diode.

According to the Inventor's experiment, if $\beta Q_1 \approx 0.15$, $\beta Q_2 \approx \beta Q_3 \approx 20$, $C \approx C_{J2} \approx 2pF$, $R_1 \approx 20K\Omega$ and $R_2 \approx 50K\Omega$ in the circuit in FIG. 3, a $dv/dt$ withstandingness of higher than 500V/$\mu$s can be achieved, with the gate sensitivity being about 30$\mu$A. A conventional PNPN switch having the same gate sensitivity has a $dv/dt$ withstandingness of about 15V/$\mu$s. Namely, the $dv/dt$ withstandingness is about 30 times greater according to the present invention than according to the prior art method.

As described hitherto, according to the present invention, a semiconductor switch including a PNPN switch which has a high $dv/dt$ withstandingness and a high sensitivity and which could not be obtained through the conventional method, can be provided by connecting between the cathode and the cathode gate of the PNPN switch or between the anode and the anode gate of the PNPN switch a bypass circuit which is of high impedance for a small dv/dt or in the steady state and of low impedance for a large dv/dt. Further, according to the present invention, a semiconductor switch in which the dv/dt withstandingness is not lowered even during high speed switching operation, i.e. a semiconductor switch adapted for high speed switching, can be obtained.

We claim:

1. A semiconductor switch comprising a PNPN switch having an equivalently four-layer structure of p, n, p and n regions and three PN junctions;
   a transistor;
   two impedance elements and a capacitive element, wherein said transistor is connected in parallel with one of said impedance elements;
   the thus formed parallel circuit being so connected as to shunt one of said three PN junctions which is located at one extreme end terminal in dependence upon the time rate of change of voltage across said one extreme end terminal and an other extreme end terminal of said PNPN switch;
   said capacitive element being connected between the base of said transistor and the other end terminal of said PNPN switch, and the other impedance element being connected between the base and the emitter of said transistor.

2. A semiconductor switch as claimed in claim 1, wherein said PNPN switch consists of a PNP transistor and an NPN transistor, with the P collector and the N base of said PNP transistor connected respectively with the P base and the N collector of said NPN transistor, so that said PNPN switch may have an equivalently four-layer structure and three PN junctions.

3. A semiconductor switch comprising a PNPN switch having an equivalently four-layer structure of p, n, p and n regions including a P gate, a cathode, and an anode;
   a transistor;
   two impedance elements and two capacitive elements, wherein the collector and emitter of said transistor, one of said two impedance elements and one of said two capacitive elements are connected in parallel with one another, the parallel circuit thus formed being connected between the P gate and the cathode of said PNPN switch;
   the other capacitive element being connected between the base of said transistor and the anode of said PNPN switch; and
   the other impedance element being connected between the base and the emitter of said transistor.

4. A semiconductor switch comprising:
   a PNPN switch having a PNPN four-layer equivalent construction and including N-type and P-type gates and having P-type and N-type electrodes being used as an anode and a cathode, respectively;
   a transistor;
   two resistors; and
   two capacitive elements, wherein one of said resistors and one of said capacitive elements are connected between a collector and emitter of said transistor, said collector and emitter of said transistor being respectively connected to the P-type gate and N-type cathode of said PNPN switch, the other capacitive element being connected between the base of said transistor and the P-type anode of said PNPN switch, and the other resistor being connected between the base and the emitter of said transistor.

5. A semiconductor switch comprising:
   a PNPN switch having a PNPN four-layer equivalent construction and including N-type and P-type gates and having P-type and N-type electrodes being used as an anode and a cathode, respectively;
   a transistor;
   two resistors; and
   a capacitive element, wherein one of said resistors being connected between a collector and emitter of said transistor, said collector and emitter of said transistor being respectively connected to the P-type gate and the N-type cathode of said PNPN switch, said capacitive element being connected between the base of said transistor and the P-type anode of said PNPN switch, and the other resistor being connected between the base and the emitter of said transistor.

6. A semiconductor switch as claimed in claim 5, wherein said capacitive element is a capacitor.

7. A semiconductor switch as claimed in claim 5, wherein said capacitive element is a diode.

8. In a semiconductor switch comprising:
   an anode terminal;
   a cathode terminal;
   a first gate terminal;
   a PNPB switch structure defined by first and second transistors of first and second respective opposite conductivity types, the collector of said first transistor being connected in common with the base of said second transistor, the base of said first transistor being connected in common with the collector of said second transistor, the emitter of said first transistor being connected to said anode terminal, the emitter of said second transistor being connected to said cathode terminal, and the base of said second transistor being connected to said first gate terminal; and
   a third transistor, the collector and emitter of which are respectively connected to the base and emitter of one of said first and second transistors;
   te improvement comprising:
   a first resistor connected in parallel with the collector and emitter of said third transistor;
   a second resistor connected in parallel with the base and emitter of said third transistor; and
   a capacitive element connected between the base of said third transistor and the emitter of the other of said first and second transistors.

9. The improvement according to claim 8, further comprising a second gate terminal connected to the base of said first transistor.

10. The improvement according to claim 8, wherein said one of said first and second transistors is said second transistor.

11. The improvement according to claim 8, wherein said one of said first and second transistors is said first transistor.

12. The improvement according to claim 8, wherein said capacitive element is a diode.

13. The improvement according to claim 10, wherein said third transistor is of said second conductivity type.

14. The improvement according to claim 11, wherein said third transistor is of said first conductivity type.

15. The improvement according to claim 8, further comprising an additional capacitive element connected in parallel with said first resistor.

* * * * *